(12) United States Patent
Springer, III

(10) Patent No.: US 9,010,998 B2
(45) Date of Patent: Apr. 21, 2015

(54) OVERHEAD POWER CONNECTOR INTEGRITY ASSESSMENT BY APPLICATION OF THERMAL HISTORY DETECTORS

(75) Inventor: Paul LeBaron Springer, III, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 46 days.

(21) Appl. No.: 13/260,859

(22) PCT Filed: Mar. 2, 2010

(86) PCT No.: PCT/US2010/025905
§ 371 (c)(1),
(2), (4) Date: Sep. 30, 2011

(87) PCT Pub. No.: WO2010/101907
PCT Pub. Date: Sep. 10, 2010

(65) Prior Publication Data
US 2012/0106591 A1   May 3, 2012

Related U.S. Application Data

(60) Provisional application No. 61/156,640, filed on Mar. 2, 2009.

(51) Int. Cl.
| | | |
|---|---|---|
| G01N 25/00 | (2006.01) | |
| H02G 7/00 | (2006.01) | |
| G01K 3/04 | (2006.01) | |
| G01K 11/12 | (2006.01) | |
| G01R 31/04 | (2006.01) | |

(52) U.S. Cl.
CPC .. *H02G 7/00* (2013.01); *G01K 3/04* (2013.01); *G01K 11/12* (2013.01); *G01R 31/043* (2013.01)

(58) Field of Classification Search
CPC ........... H02G 7/00; G01K 11/12; G01K 3/04; G01R 31/043
See application file for complete search history.

(56) References Cited

U.S. PATENT DOCUMENTS

| | | | | |
|---|---|---|---|---|
| 3,204,231 A | * | 8/1965 | Kolster | ............ 116/218 |
| 2002/0170739 A1 | * | 11/2002 | Ryeczek | .......... 174/112 |

(Continued)

FOREIGN PATENT DOCUMENTS

WO   2010101907   9/2010

OTHER PUBLICATIONS

McGraw-Hill Dictionary of Scientific and Technical Terms, 2003, McGraw-Hill Companies, Inc. sixth edition, p. 2001.*

(Continued)

*Primary Examiner* — Lisa Caputo
*Assistant Examiner* — Janice M Soto
(74) *Attorney, Agent, or Firm* — Troutman Sanders LLP; Ryan A. Schneider; Christopher W. Glass

(57) ABSTRACT

Systems and methods for monitoring the integrity of an overhead power connector are disclosed. The systems and methods may include applying a temperature sensitive material to at least a portion of an overhead power connector and/or an overhead power conductor. The integrity of the overhead connector may be monitored or diagnosed by monitoring the properties of the temperature sensitive material to determine if the overhead connector experienced any high temperature excursions.

23 Claims, 2 Drawing Sheets

(56) References Cited

U.S. PATENT DOCUMENTS

2005/0040809 A1    2/2005   Uber, III et al.
2008/0063026 A1*   3/2008   Roche .......................... 374/162
2008/0121171 A1*   5/2008   Hulsey ......................... 116/216

OTHER PUBLICATIONS

International Search Report and Written Opinion dated Apr. 28, 2010 for related PCT Application No. PCT/US2010/025905.
Office Action Issued by the Chilean Patent Office dated Feb. 15, 2013 for related Chilean Patent Application No. 201102151.

* cited by examiner

OVERHEAD POWER CONNECTOR INTEGRITY ASSESSMENT BY APPLICATION OF THERMAL HISTORY DETECTORS

CROSS REFERENCE TO RELATED APPLICATION

This patent application claims priority under 35 U.S.C. §119 to U.S. Provisional Patent Application Ser. No. 61/156,640 file on Mar. 2, 2009, which is hereby incorporated by reference in its entirety.

FIELD OF THE INVENTION

The invention is directed to overhead power line connectors and monitoring the integrity of overhead power line connectors. Embodiments of the system and method comprise monitoring the temperature history of the connector to determine its integrity.

BACKGROUND

Overhead power lines comprise overhead power conductors spliced together with overhead connectors. Electrical power passes from a conductor into the connector and into the next conductor. The overhead connectors are a weak link in the system. Due to failure of these overhead connectors, the reliability of overhead power lines has become an impediment to increasing the electrical power flow through the electrical grid.

Overhead power connectors may fail as a result of improper installation, corrosion, or age. These problems lead to increased resistance through the connector and, therefore, an increase in temperature. The connectors may overheat eventually resulting in catastrophic failure of the connector, loss of transmission of electricity through the conductor, and significant electrical and impact hazards to line crews and anyone in the vicinity of the failed connector.

The amount of heat generated in an overhead conductor is proportional to the resistance of the conductor and to the square of current being carried on the conductor. The ultimate temperature of the conductor or a connector is dependent upon the heat generated in the conductor minus the heat lost through convection, radiation, and conduction.

The principal function of a connector is to secure two conductors together and to carry the electrical and mechanical load from one conductor to the next over its full service life. The electrical load of conductors may vary daily from no load to full load and, at times, the conductors may be overloaded. The temperature of the conductors and connectors will therefore vary based upon the heat generated in the conductor and by the ambient temperature and other weather conditions. Properly installed, healthy, overhead power line connectors typically have less resistance and more surface area for heat dissipation, therefore, conductors typically have a normal operating temperature that is less than the normal operating temperature of the conductor.

To increase reliability and anticipate connector failures, connectors are monitored to determine their current integrity in an attempt to predict connector failures. Though many connectors last longer than 60 years; some fail early in service. Early connector failures may result from improper installation, for example. The failure mechanism is usually characterized as a thermal runaway of the connector sleeve due to high resistance. It is well accepted in the power industry that electrical resistance of a connector is a good indicator of degradation and remaining service life. The resistance ratio, a measure of the connector resistance to the conductor resistance, is most commonly used to determine if a connector has failed or will soon fail. Temperature measurements are also used. In laboratory tests, ANSI C119.4 defines connector failure as temperature of the connector exceeding that of the conductor. Both indicators, resistance and temperature, are employed in field inspections. Inspection crews typically assess these connector conditions by real-time methods that measure only the status of the connector during the test period.

There are currently two commercially available methods for monitoring the integrity of an overhead power connector. Current monitoring techniques are based upon the theory that the connectors display a gradual increase in resistance over time on their way to failure. According to this theory, instantaneous assessment of the condition of the connector should be effective to determine if the connector may fail. In one method, the temperature of the connector is measured using infrared (IR) measurement techniques. As previously discussed, temperature is an indirect measurement of the electrical resistance of the connector. As connectors fail, the resistance increases across the connector and should be indicated by a higher than normal temperature. However, the temperature measurement of the connector is affected by other factors such as wind and load on the line. IR temperature measurement identifies "hot" connectors by thermal imaging but results are poor if line load is low or the wind is blowing. Therefore, an instantaneous temperature reading by IR of a connector is not a reliable measure of integrity of the overhead power connector as temperature is only an indirect measurement of resistance.

A second method is to directly measure the resistance of the connector by a live-line micro ohmmeter. The constant measure of the micro-ohm resistance of the connector can then be monitored to determine the integrity of the connector. While direct measurement of resistance is not confounded by wind or low line current, it still suffers from the problems such as improper measurement due to human error and due to the intermittency of high resistance episodes in the connector. Direct resistance measurement, provided by instruments such as SENSORLINKS OhmStik®, incorporates the resistance ratio method.

Other methods have been proposed to monitor the integrity of the overhead connectors including visual examination and X-ray inspection. Visual examination is qualitative and only very degraded connectors are found. In-service X-ray has proven to be prohibitively expensive, and normally used only to detect strand breaks due to fatigue. All of these methods have one thing in common: they provide a snapshot assessment of the connector's condition but do not give any indication of its thermal history. If the conventional theory of connector failure is not correct, these methods would not be reliable to determine the integrity of the connector.

There is a need for a reliable systems and methods for determining and monitoring the integrity of an in-service overhead line connector.

SUMMARY

Embodiments of a method for monitoring the integrity of an overhead power connector comprise using a temperature sensitive material to monitor or diagnose the integrity of an overhead connector. A temperature sensitive material in contact with at least a portion of an overhead connector is used to determine whether the connector has experienced a thermal excursion. The method for monitoring the integrity of an overhead power connector may further comprise applying or having a temperature sensitive material in contact with an overhead power conductor in an area adjacent to the overhead power connector. As used herein, an area adjacent to the overhead power connector may be any area wherein both the temperature sensitive material on the connector and the temperature sensitive material on the conductor may be viewed from the same location. The temperature sensitive materials may be the same material or different materials. Such an embodiment may further comprise comparing properties of the temperature sensitive coating on the overhead power conductor to the color of the temperature sensitive coating on the overhead power connector to determine the integrity of the overhead power connector.

A further embodiment of the method for monitoring the integrity of an overhead power connector may comprise applying a temperature sensitive material to at least a portion of an overhead power connector, wherein the temperature sensitive material comprises an irreversible color transition point at a temperature of at least 40° C. above the normal operating temperature of the connector. The temperature sensitive material may then be monitored by determining if the color of the temperature sensitive material on the overhead power connector.

A further embodiment of a system for monitoring the integrity of an overhead connector may comprise a first overhead power conductor for conducting electricity and a second overhead power conductor for conducting electricity spliced together by a connector. The connector of the system may be provide mechanical connection and electrical communication between the first overhead power conductor and the second overhead power conductor. A temperature sensitive material may be in contact with the connector. Further, at least one of the conductors may comprise a temperature sensitive coating in an area adjacent to the connector.

Throughout this description, various components can be identified as having specific values or parameters, however, these items are provided as exemplary embodiments. Indeed, the exemplary embodiments do not limit the various aspects and concepts of the present invention as many comparable parameters, sizes, ranges, and/or values can be implemented. The terms "first," "second," and the like, "primary," "secondary," and the like, do not denote any order, quantity, or importance, but rather are used to distinguish one element from another. Further, the terms "a," "an," and "the" do not denote a limitation of quantity, but rather denote the presence of "at least one" of the referenced item.

Other aspects and features of embodiments of the present invention will become apparent to those of ordinary skill in the art, upon reviewing the following description of specific, exemplary embodiments of the present invention in concert with the figures. While features of the present invention may be discussed relative to certain embodiments and figures, all embodiments of the present invention can include one or more of the features discussed herein. While one or more embodiments may be discussed as having certain advantageous features, one or more of such features may also be used with the various embodiments of the invention discussed herein. In similar fashion, while exemplary embodiments may be discussed below as system or method embodiments it is to be understood that such exemplary embodiments can be implemented in various systems and methods.

DESCRIPTION OF EMBODIMENTS OF THE INVENTION

Figure 1:
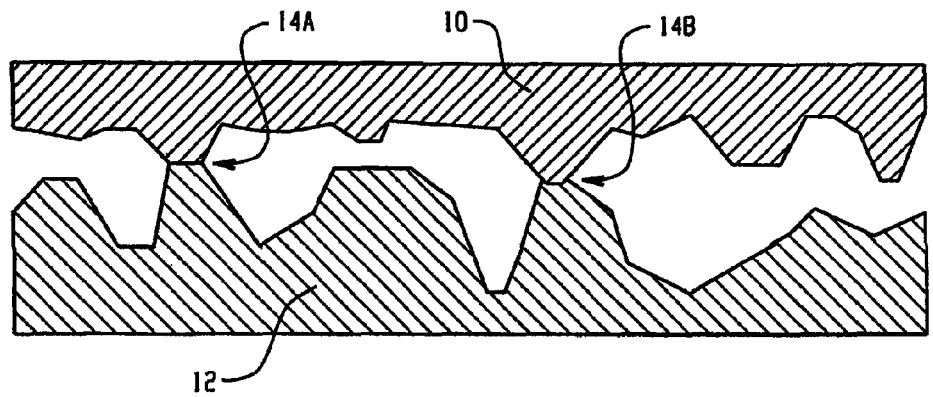
FIG. 1 is an enlarged depiction of the interface between a conductor and an overhead connector showing the asperity contacts between the conductor and the connector.
Figure 2:
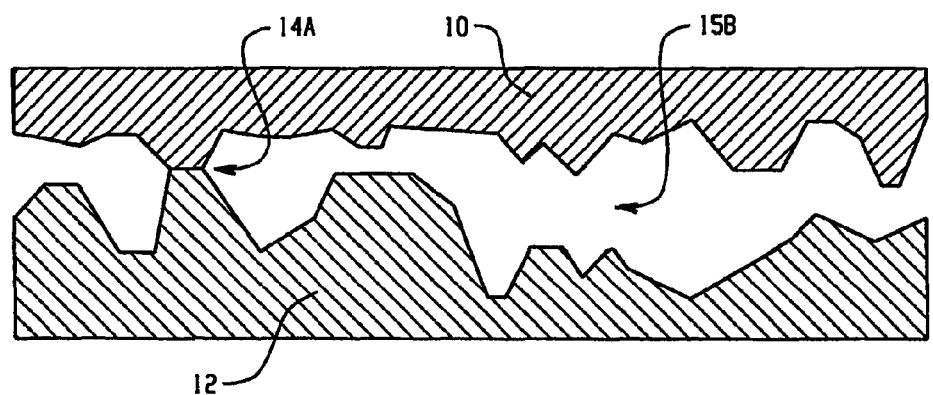
FIG. 2 is the same enlarged depiction of the interface between a conductor and an overhead connector after damage has occurred reducing the number of asperity contacts.

Embodiments of the system and method for monitoring the integrity of an overhead connector comprising applying or attaching a temperature sensitive material to an overhead connector. The inventor has discovered that the conventional theory of overhead connectors is unreliable for determining the integrity of an in-service overhead connector. Conventional methods of monitoring or diagnosing connector failure are based upon the assumption that overhead connectors fail in a slow and continuous manner that is the result of an associated consistent measurable increase in resistance through the connector or a consistent increase in temperature of the connector. Therefore, power companies rely on instantaneous or periodic spot temperature or resistance measurements to monitor the integrity of their overhead connectors. The inventor has determined that such instantaneous or spot measurement techniques are not reliable methods to determine overhead connector reliability. A typical connection between an overhead connector 10 and an overhead power conductor 12 is shown in FIG. 1. The connection between the connector 10 and conductor 12 is not continuous but is made by many asperity contacts 14A and 14B. Current path in connector 10 is at locations of these asperity contacts 14A and 14B where micro-high-spots on the conductor 12 contact micro-high-spots on the connector 10 during installation. As shown in FIG. 2, thermal stresses generated during service causes ruptures of some of the asperity contacts 15B while asperity contacts 14A are not damaged. This loss of asperity contacts decreases the overall cross sectional area for flow of electricity from the conductor 12 through the connector 10, thereby increasing its resistance. The number of asperity contacts 14A and 14B in a properly installed connector 10 may number in the millions. The conventional theory is that asperity contacts degrade substantially linearly with time and the resistance shows a steady increase from installation to failure. The novel theory of connector failure proposes that during extreme thermal excursions, the internal temperature gradients generate sufficient shearing forces on the interface to establish a significant number of new asperity contacts, and thereby allow the resistance of the connector to return to a normal range, albeit in fragile condition. This element of the novel theory is used to determine the appropriate trigger temperature for the temperature sensing material. This is a critical insight for avoiding false positive indications during line faults and other overloads on the conductor/connector system.

The inventor determined that connectors do not undergo a steady increase in temperature or resistance, but have periods of temperature rises above the normal operating temperature range of the conductor that will damage the connector. Connectors typically operate at a nominal operating temperature but experience multiple thermal excursions as the ultimate failure approaches. After most thermal excursions the connector will return to the nominal operating temperature. Though the temperature may return to within the normal operating temperature range, the connector is fragile and will eventually suffer additional thermal excursions. Eventually, the connector is sufficiently damaged and resistance is sufficiently increased that the connector cannot recover from a subsequent thermal excursion. At that time, the connector may experience a thermal excursion wherein the temperature increases rapidly up to the failure temperature.

Figure 3:
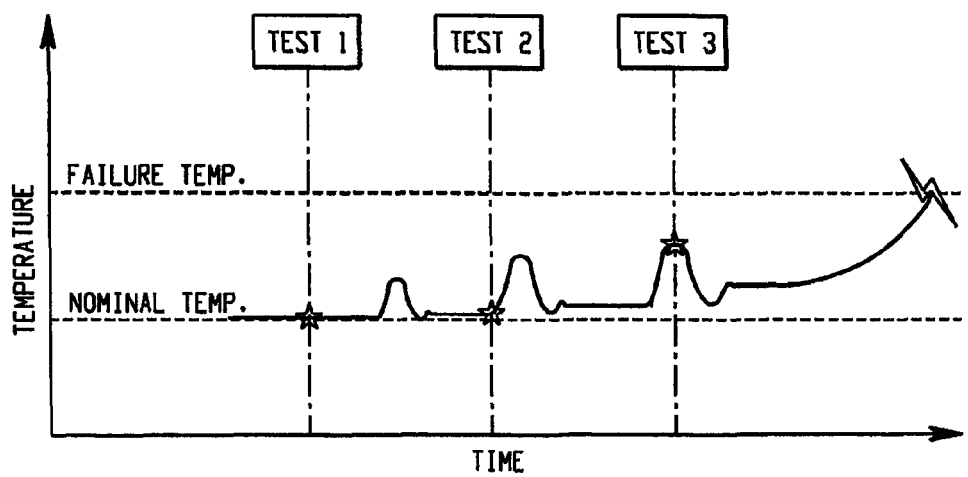
FIG. 3 is a temperature versus time graph for a conductor over its service life; the graph shows that contrary to conventional theory, connectors may experience multiple temperature excursions where the temperature is elevated for a short period but returns to the nominal operating temperature until a temperature excursion elevates the connector temperature above the failure temperature; the mechanism for the apparent healing of the connector and the return to resistance within the normal range is that thermal stresses shear the interface between the connector and the conductor; the shearing action establishes new asperity contacts, allowing the resistance to return temporarily to normal.

These temperature excursions may be the result from many different factors including, but not limited to, high loads carried on the line, environmental factors stressing the connector and the connection, improper installation, or other factors. Testing of connectors show evidence that after repeated thermal excursions in a connector leads to an eventual catastrophic thermal runaway/burn-down. Contrary to the conventional theory of describing a steady increase in resistance and temperature of in-service connectors, testing and failure analysis of in-service connector failures by the inventor shows clear evidence that connectors experience unstable thermal behavior prior to complete thermal failure. The graph of FIG. 3 shows the temperature versus time graph for the life span of a typical connector. The connector may experience several temperature excursions prior to catastrophic failure. As can be seen, the temperature of the connector is normally operating close to the nominal temperature range, though the connector has experienced several temperature excursions due to reduced the number of asperity contacts. Using conventional IR temperature monitoring techniques, a test would have to be performed during one of the temperature excursions to indicate upcoming failure. Spot measurements for Test 1 and Test 2 as shown on the graph would show no evidence of damage to the connector; only at the point of Test 3 would an IR temperature reading indicate damage to the connector. This understanding and observations have significant negative implications on the reliability of IR and live-line micro-ohmmeter measurements to determine the integrity of an overhead connector. Therefore, a system and method of continuous monitoring of the temperature of an overhead connector and/or the two conductors attached to the connector would be advantageous to determine the integrity of the connector. A continuous monitoring system and diagnostic method would be able to identify whether any significant temperature excursions have been experienced by the connector. Such a reliable system and method of continuous monitoring could include applying a temperature sensitive material that experiences a change in properties at a temperature transition point to the connector. A key difference between the systems and methods described herein and other prior temperature indicating systems is that electrical overload is not what is detected. In prior systems is assumed that electrical loads are in the normal range, and that the high temperature of the connector is due only to excessive resistance. The systems and methods described herein are designed to tolerate some degree of overload of the electrical system, while still maintaining its diagnostic capability for connectors that are close to failing.

As used herein, "applying a temperature sensitive material" includes, but is not limited to, applying a liquid temperature sensitive material such as a thermochromatic paint, attaching an temperature sensitive material such as a plastic wrap, bands, or other indicator, or incorporating a temperature sensitive material into the connector and/or conductor prior to installation of the connector, for example. Specific embodiments of the system for monitoring the integrity of overhead power connectors comprise applying a temperature sensitive coating to the connector or producing the connectors from temperature sensitive materials.

Figure 4:
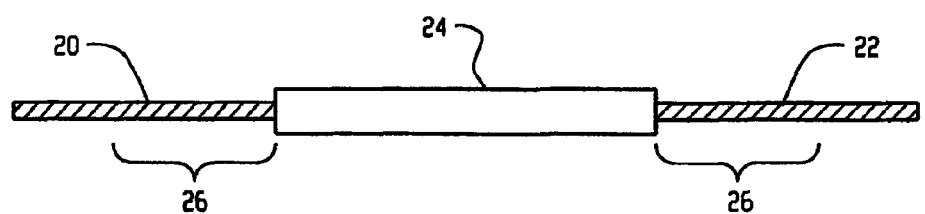
FIG. 4 is a depiction of a typical connector splicing a first conductor and a second conductor together.

Embodiments of the system and method for monitoring the integrity of an overhead connector may comprise applying a temperature sensitive material to an overhead connector or providing a connector incorporating a temperature sensitive material. Further embodiments of the system and method for monitoring the integrity of an overhead connector may comprise applying a temperature sensitive material to at least a portion of an overhead power connector and an overhead power conductor in an area adjacent to the overhead power connector. In FIG. 4, a first conductor 20 is spliced to second conductor 22 with connector 24. The connector may comprise a temperature sensitive material with a first transition point. At least one of the first conductor 20 and the second conductor 22 may also comprise a temperature sensitive material in an area adjacent to the conductor 26. The temperature sensitive material on the conductor may have the same transition temperature as the temperature sensitive material on the connector 24 or the transition temperature may be different. Additionally, either the conductors 20 22 or the connector 24 may comprise two or more temperature sensitive materials with different transition points. In any such embodiments, the properties of the temperature sensitive coatings on the overhead power conductor may be compared to the properties of the temperature sensitive coatings on the overhead power connector to determine the integrity of the overhead power connector.

The temperature sensitive material may be any material that undergoes a temperature sensitive transformation at a temperature transition point. The temperature sensitive transformation may be any measurable property change including, but are not limited to, a phase change, a color change, emissive property, a structural change or other indication. Preferably, the temperature sensitive transformation is visually identifiable, but may be identifiable by use of an analytical instrument.

A preferred temperature sensitive material for certain embodiments has a nominal transition temperature of 40° C. above the normal operating range of the overhead power connector. For additional embodiments, the temperature sensitive material may have a nominal transition temperature of 60° C. above the normal operating range of the overhead power connector. According to the conventional theory, measurement of such high temperatures in a connector would be too high; as stated previously conventional theory states that a connector has failed when the temperature of the connector is the same as the temperature of the conductor. The novel theory of connector failure predicts that temperature excursions are extreme, and allow for a healthy margin in the trigger temperature above normal temperature to avoid false triggering during faults, while still ensuring that all failing connectors are identified in time for a scheduled replacement.

A noteworthy characteristic of the temperature sensitive materials is time period required at specific temperature to cause the transition in the properties. Certain thermochromatic paints, for example, change colors within 10 minutes at the reported nominal transition temperature. At temperatures below the nominal transition temperature, the transition or properties change may occur but the transition time of the temperature sensitive material will take longer. Transition time at lower temperatures varies with each material and in the case of multi-change material each transition may have different characteristics. The transition temperatures of any specific material are dependent on the temperature and time at the temperature. As used herein, the nominal transition temperature ("transition temperature") is defined as a temperature at which the temperature sensitive material changes properties by to that temperature for 10 minutes. For example, in embodiments of the system and method for monitoring the integrity of overhead connectors, the temperature sensitive material may comprise a transition point above a temperature above 120° C. or for other embodiment with higher normal operating ranges, the temperature sensitive material comprises an irreversible color transition point above a temperature of approximately 135° C. In certain embodiments, the temperature sensitive material may undergo an irreversible property change at the temperature transition temperature. The temperature sensitive material may be a dielectric material.

The temperature sensitive material may be any material capable of indicating a temperature excursion on an overhead power line; preferably the temperature sensitive material will undergo an irreversible change in properties at the temperature transition point. For example, the temperature sensitive coating may be thermochromatic paint, thermochromatic waxes or other coatings, a plastic sheath, temperature sensitive labels, a mechanical temperature operated indicator, or such a material incorporated directly into the connector. A mechanical temperature sensitive material may include a portion that changes properties such as shape, phase or size, or activates a mechanical indicator to appear or may be a colored band. For example, a system of colored bands may be placed just inside the mouth of the connector. As the connector begins to heat, the conductor strands may undergo physical change (expansion, pullout, sag) thus displaying the colored bands outside the mouth of the connector.

Temperature sensitive labels may be used. Large adhesive strips that cover a wide temperature range (i.e. 100-250° C. in 25° C. increments, for example) change contrast/color to indicate when a temperature threshold has been exceeded. The highest temperature reached by the connector may be indicated by which bands show the change in properties.

Thermochromatic waxes, paints, and coatings change color at given transition temperatures. Currently, these materials are typically used in indoor environments.

Embodiments of the method for monitoring the integrity of overhead connectors may further comprise monitoring the change in properties of the temperature sensitive material such as a color change. Monitoring the color change of the temperature sensitive material may comprise comparing the properties of the temperature sensitive material on the connector to the properties of the temperature sensitive material on the conductor. The comparison of the differences of the properties of the temperature sensitive material on the conductor and the temperature sensitive material on the connector may provide more information than merely monitoring the properties of a temperature sensitive material on a connector. For example, embodiments of the method of monitoring the integrity of an overhead connector may comprise replacing the connector when the temperature sensitive material on the connector indicates the connector was above temperature transition point and the temperature sensitive material on the conductor indicates the conductor remained below the temperature transition point. In this case, it would be reasonable to conclude that a significant amount of asperity contacts have been damage to affect the resistance through the connector. Further embodiments of the method of monitoring the integrity of an overhead connector may comprise replacing the connector when the temperature sensitive material on the conductor indicates only a portion of the strands of the conductor were above a temperature transition point. This is indicated by a property change of the temperature sensitive material on a portion of the strands on the conductor and a portion of the strands remained below the temperature transition point. The result is described as a barber pole effect. In such a case, the connector may have lost contact with a portion of the strands and most of the electric flow is through only the portion of the strands that have been overheated. To facilitate location of failing connectors, the connectors and/or conductors may be monitored by personnel transported by helicopter, land vehicle, beast, or on-foot.

Further embodiments of the method for monitoring the integrity of an overhead power connector may comprise applying a temperature sensitive material to at least a portion of an overhead power connector, wherein the temperature sensitive material comprises an irreversible color transition point at a temperature of at least 40° C. above the normal operating temperature of the conductor. The method may further include monitoring the color of the temperature sensitive material on the overhead power connector to determine the integrity of the overhead power connector.

Further embodiments of the system for monitoring the integrity of a overhead connector may comprise a first overhead power conductor for conducting electricity, a second overhead power conductor for conducting electricity, and a connector connected to and providing electrical communication between the first overhead power conductor and the second overhead power conductor, wherein the connector comprises a temperature sensitive coating. The system may further include at least one of the conductors comprises a temperature sensitive coating in an area adjacent to the connector and preferably both the first overhead power conductor and the second overhead power conductor comprise a temperature sensitive coating in an area adjacent to the connector.

Overhead connectors may be manufactured from temperature sensitive materials or may be manufactured incorporating permanently attached or replaceable components comprising temperature sensitive materials.

EXAMPLES

The invention is directed to systems and methods for improving the reliability of connectors used by power companies on overhead power lines. Embodiments of the system and method may be used for monitoring both presently in-service connectors and connectors for new installations.

Thermochromatic paints, which change color at prescribed temperatures, were tested as temperature sensitive materials for use in embodiments of the system and method. Based on the normal operating temperatures for typical overhead power lines, thermochromatic paints from four different paint manufacturers were evaluated. Evaluation of the paints included four tests to determine or estimate the thermal performance, UV resistance, thermal cycling, and visibility of the paint.

The test results suggest that thermochromatic paints are reliable temperature sensitive materials that can reliably monitor the thermal history of overhead connectors and conductors and have a useful life of approximately five years or more. Little to no physical degradation of the thermochromatic paints was observed during the UV and thermal cycling tests. However, tests revealed an inherent characteristic of the paints evaluated. Prolonged exposure to temperatures below the trigger temperature may result in a premature color transition. Careful consideration of transition temperature is needed to reduce the potential for a false positive indication caused by prolonged exposure to temperature near the nominal transition temperature. Temperature sensitive materials comprising a 40° C. nominal transition temperature above the normal operating temperature range of the connector provides the desired indication should a connector experience a significant thermal excursion and minimize the chances for false positive indications. This property may be accommodated for most applications; however, specific embodiments may require a temperature sensitive material with different transition properties.

Test did determine that color transitions may occur as much as 40° C. below nominal transition temperature after extended long-term exposure for some temperature sensitive materials. However, the methods and systems are still functional if a temperature margin is provided.

Six commercially available thermochromatic paints were tested. The results are shown in Table 1 and the exemplary paints are described in Tables 2 and 4. The tested conductors are listed in Table 3 with their normal operating temperatures. The results of testing showed that thermochromatic paints may be used in systems and methods for monitoring the integrity of overhead connectors. Not all thermochromatic paints performed well. Four tested paints (MC 165-2, MC 104-2, KN-4 and KN-11) had good to excellent performance for both color transition and durability in the power line environment. A service life of five (5) years or longer may be projected for these paints.

OVERALL RESULTS

TABLE I

Performance Summary

| Paint Model No. | Transition Colors and Temperature | Overall Results |
|---|---|---|
| KN 4 | Blue-Green @ 104° C. Green-Olive @ 207° C. | 5-year durability demonstrated. $1^{st}$ transition OK, $2^{nd}$ transition did not trigger. |
| KN 11 | Pink-Blue @ 135° C. Blue-Grey @ 205° C. | 5-year durability demonstrated. $1^{st}$ transition OK, $2^{nd}$ transition was not evaluated. |
| MC-165-2 | Pink-Purple @ 165° C. | 5-year durability demonstrated. Trigger temperature OK. |
| MC-104-2 | Blue-Green @ 104° C. | 5-year durability demonstrated. Trigger temperature OK. |
| C-HSWR | Pink-Magenta @ 100° C. | Poor weathering characteristics |
| CT 165WR | White-Grey @ 165° C. Grey-Dk. Brown @ 185° C. | Difficult to apply; poor weathering characteristics; transition temperature 100° C. below published transition temperature. |

Table 2 below lists the thermochromatic paint providers.

TABLE 2

| Product ID | Manufacturer |
|---|---|
| KN4 | Thermal. Paint Temperature Technology, Inc. (TPTT) |
| KN 11 | TPTT |
| MC-104-2 | Technical Industrial Products (TIP/TEMP) |
| MC-165-2 | TIP/TEMP |
| C-HSWR Red | Colour-Therm Limited (CTL) |
| CT-165 | CTL |

TABLE 3

Summary of Conductor Types and Normal Operating Temperatures

| Conductor Type | Normal Operating Temperature |
|---|---|
| Aluminum Conductor Steel Supported (ACSS) | 200° C. |
| Aluminum Conductor, Steel Reinforced (cable) (ACSR) | 180° C. |
| ACSR | 125-140° C. |
| All Aluminum Alloy Conductor (AAAC) | 95-125° C. |
| ACSR | 95-110° C. |

As previously discussed, thermochromatic paints may comprise reversible or irreversible transitions. Reversible paints change color at a prescribed temperature but return to their original color when the temperature falls back below the transition point. Irreversible paints change color permanently once a temperature has been exceeded. As discovered by the inventor, connectors and conductors undergo a normal thermal cycling. Thus, the use of a reversible coating would indicate a thermal excursion while it was occurring and an irreversible coating would indicate permanently whether the connector had undergone a significant thermal excursion. In addition to reversible and irreversible varieties, thermochromatic paints are available as single change or multi-change indicators. Single change paints transform from one color to another at first nominal transition temperature. Single-change paints exhibit a more stable color transition. Manufacturers claim that color change may initiate closer to the trigger point in single change paints. While multi-change paints have at least two points of transition temperatures, testing showed that single-change paints were more reliable indicators of the integrity of overhead connectors. Further testing and analysis showed that multi-change thermochromatic paint is not necessary for most applications of the systems and methods of monitoring the integrity of the connectors. Some thermochromatic paints may have as many as ten transition temperatures. Embodiments of the system and method for monitoring the integrity of overhead connectors may comprise either single transition, multi-transition temperature sensitive materials, a plurality of single transition temperature sensitive materials having different transition temperatures, or combinations thereof.

In addition, the mechanism of color transition should be considered. Some paints change via oxidation, and therefore the paint may give false indication when exposed to air over long periods of time. These paints should be recoated appropriately or combined with non-oxidizing vehicles to improve the reliability of the indication. Six thermochromic paints were selected for laboratory testing. Table 4 summarizes the selections and their nominal transition temperature(s).

TABLE 4

Summary of Selected Paints and Trigger Temperatures

| Paint Model No. | Original Color | First Transition | Second Transition |
|---|---|---|---|
| TPTT KN 4 | Blue | Green 104° C. | Olive at 207° C. |
| TPTT KN 11 | Pink | Blue at 135° C. | Gray at 205° C. |
| TIP-TEMP MC-165-2 | Pink | Purple 165° C. | N/A |
| TIP-TEMP MC-104-2 | Blue | Green 104° C. | N/A |
| CU C-HSWR | Pink | Magenta 100° C. | N/A |
| CT 165WR | White | Gray 165° C. | Dk. Brown at 185° C. |

All the paints in Table 4 were tested and the transitions were found to occur within ±8° C. of the published temperatures.

Test Procedures and Results

Laboratory testing of the selected paint products was designed to show if the thermochromatic paint provides accurate in-service thermal history indication of overhead connectors and the adjacent conductor. The properties evaluated included performance (i.e., accuracy and repeatability of color transition), ease or application and use, adhesion, weathering resistance, thermal/humidity cycling durability, and visibility.

Thermal Performance Test

Five thermochromatic paints were selected for actual performance testing. CT 165WR was omitted from the test matrix due to difficulty with applying it to a sample, consistency was very thin making applying a uniform coating problematic. The remaining products (with the exception of KN4) were applied according to manufacturer's instructions to connectors and conductors in two test loops each. The test loops consisted of single stage and/or dual stage connectors installed on 477 kcmil 26/7 "Hawk" ACSR conductor as outlined in ANSI C119.4. KN4 was applied to the control conductor. Initial test settings were established under the following operating conditions:

Test current: 659 Amps
Control conductor temperature: 54.7° C.
Cycle setting: 90 min. current ON/90 min. current OFF
Data logging: 10 minutes During the test, these settings were adjusted as needed to increase conductor and connector temperature. A visual examination was conducted at regular intervals and confirmed with the data file to determine the time of transition. Two secondary evaluations were conducted as part of the performance test, namely ease of application and adhesion. Ease of application was noted by degree of difficulty scaled from 1 to 3. A rating of 1 denotes that the paint was applied with relative ease and resulted in a uniform, clearly visible coating on both connector and conductor. A rating of 3 denotes that the application of the paint required effort significantly greater than expected and resulted in a non-uniform and/or indistinguishable coating.

Adherence was evaluated based on a visual examination during the heat cycle test. "Excellent" adherence was noted for those coatings that showed no signs of flaking, cracking, or wash-out. "Good" adherence denoted coatings that appeared to be thinner than when originally applied but maintained some uniformity. "Poor" adherence was noted for any coating that exhibited flaking, cracking, or wash-out.

Tables 5a and 5b highlight the results of the test. Note where two values are given as Transition Temp. or Transition Time in Table 5a, the first valve represents the conductor performance and the second valve represents the connector performance.

TABLE 5a

Summary of Performance Test

| Paint Model No. | Original Color | "As-Found" Color | Transition Temp. | Transition Time |
|---|---|---|---|---|
| KN 4 | Blue | Green | 99.1.° C. | 10 min. |
| KN 4 | Green | Green[1] | N/A | N/A |
| KN 11 | Pink | Purple[2] | 120.4° C. | 5* hours |
| KN 11 | Pink | Purple | 1151° C. | 15* hours |
| MC-165-2 | Pink | Purple | 161.4° C. | 10 min. |
| MC-165-2 | Pink | Purple | 166.4° C. | 10 min. |
| MC-104-2 | Blue | Green | 77.2° C. | 4* hours |
| MC-104-2 | Blue | Green | 80.4° C. | 4* hours |
| C-HSWR | Pink | Magenta | 79.8° C. | 4* hours |
| C-•ISWR | Pink | Magenta | 91.3° C./104.2° C. | 30 min. 0 min. |
| CT 165WR | White | | Did not test | |

[1]See summary point #1 in discussion following Table 5b.
[2]See summary point #2 in discussion following Table 5b.

TABLE 5b

Summary of Secondary Evaluations of Performance Test

| Paint Model No. | Ease of Application | Adhesion | Observations |
|---|---|---|---|
| KN 4 | 1 | Excellent | Color remained saturated and highly |
| KN 11 | 1 | Excellent | Transition color is more akin to purple. |
| MC-165-2 | 1 | Excellent | Transition color is more akin to purple. |
| MC-104-2 | I | Good | Color lost some saturation on conductor. |
| C-HSWR | 2 | Poor to Good | Paint appearance washed out as time progressed. Noted particularly for conductor. Connector adherence appeared "good". |
| CT 165WR | 3 | | Did not test |

The following highlights were observed for the performance test:

1. Despite more than 45 minutes above 205° C. and longer at temperatures below 205° C. but high enough for a trigger, KN4 did not make the second color transition to olive as claimed.

2. Connector failure was observed for one of the test loops. The test failure was indicated by a color transition of the connector only. Three connectors ran cooler than the conductor and exhibited by a color transition of the conductor only. For the remaining samples, the connector and conductor transitioned simultaneously.

3. All paints excluding KN4 exhibited a color transition within the range of the prescribed trigger temperature. Performance was repeatable for all test samples.

4. Four of the six paints were easy to use and adhered to the test surfaces well. Paint Model No. C-HSWR had mixed results (see Table 3b).

TABLE 6

Field Inspection Matrix

| Connector Indicator | Conductor Indicator | Meaning |
|---|---|---|
| Below transition | Below transition | Connector OK, line has not been hot |
| Below transition | Above transition | Connector OK, line has been heavily loaded |
| Above transition | Below transition | Connector resistance critical - action required |
| Above transition | Above transition | Connector and the conductor overheated - assessment needed* |
| ANY | "Barber Pole" | Connector losing contact with some strands - action required |

*Connector has probably failed, since the spice should run much cooler than the connector. If this is a low-mass connector, temperature difference is less, and the connector may be okay.

UV Aging Test

Following the performance test, all six paint samples were subjected to an accelerated UV aging test. Though there is no direct correlation between laboratory UV and actual outdoor weathering; however, comparison of different products is effective. Each coating was applied to six aluminum test coupons, 3" by 6", according to manufacturer's instructions. For each coating, the six coupons were split into two sets of three. UV inhibiting oil was applied to one set of samples while the others were left uncoated. All samples were subjected to 1000 hours accelerated weathering that consisted of alternating 4-hour cycles of UV at 60° C. and condensation at 50° C. At the completion of the exposure period, each sample was examined for visible changes. Color change, physical degradation (i.e. cracking, checking, flaking. etc.), and damage were noted. Those samples coated with UV inhibitor were especially scrutinized, Results of the UV test are summarized below and in Table 7:

1. Four of the six paints changed color after less than 1000 hours of exposure to temperatures between 50° C. and 60° C.
2. Two paints, CT-165 and C-HSWR, exhibited excessive streaking and run-off. No physical degradation was observed for the remaining samples.
3. The KN-4 and MC-104 samples that were not coated with UV inhibitor exhibited minor discoloration, which appeared as burn marks. The coated samples did not.
4. The UV inhibitor did not appear to be effective on CT-165 and C-HSWR samples.

TABLE 7

Summary of Accelerated UV Aging Test

| Paint Model No | Original Color | "As-Found" Color | Target Trigger | Difference between Target and Actual Temp. at Transition |
|---|---|---|---|---|
| KN 4 | Blue | Green | 104° C. | 44° C. |
| KN 11 | Pink | Pink | 135° C. | N/A* |
| MC-165-2 | Pink | Pink | 165° C. | N/A* |
| MC-104-2 | Blue | Green | 104° C. | 44° C. |
| C-HSWR | Pink | Magenta | 100° C. | 40° C. |
| CT 165WR | White | Brown | 185° C. | 125° C. |

*These samples did not exhibit a color change over the duration of the test.

Thermal Cycling Test

In addition to UV resistance, durability through thermal cycling and humidity was assessed in a simultaneous, separate effort. A total of six connector samples and six conductor sections were coated with thermochromatic paint and placed in a thermal aging chamber. The test profile consisted of 14 days of aging with alternating cycles of cold (4 hours at −40° C.) and hot (4 hours at 85° C./90% RH). Following the aging, the samples were removed and examined for signs of change (degradation, color, etc.). The results are presented in Table 8.

TABLE 8

Summary of Thermal Cycling Test

| Paint Model No. | Original Color | "As-Found" Color | Observations |
|---|---|---|---|
| KN 4 | Blue | Green | Paint changed color w/in 20° C. of trigger; no damage noted |
| KN 11 | Pink | Pink | No visible change or damage noted |
| MC-165-2 | Pink; Fuchsia | Pink/Fuchsia | No visible change or damage noted |
| MC-104-2 | Blue | Green | Paint changed color w/in 20° C. of trigger; no damage noted |
| C-HSWR | Pink | Magenta | Paint changed color w/in 15° C. of trigger; no damage noted |
| CT 165W | White | Brown | Paint charmed color w/in 100° C. of trigger; no damage noted |

Similar to the UV aging test, only two of the paints, KN-1 I and MC-165-2, did not change color under prolonged thermal exposure at temperatures more than 15° C. below the trigger temperature.

Visibility Test

The visibility test was conducted to determine the maximum viewing distance of a painted overhead connector for various weather conditions. To simulate this, one coated connector representative of each paint and the "barber pole" sample, where only specific strands of the conductor were indicated overheating, taken from the performance test were held by a hot stick at 30 feet from ground level. An initial linear distance from each sample of 200 feet was walked off with a measuring wheel. Using a pair of standard binoculars, each connector was viewed from the ground. The following observations were noted: 1) clarity of color, 2) identification of connector versus conductor, and; 3) contrast between two colors, where applicable. Two evaluations were performed, one with direct sunlight and one without. Tables 9a and 9b summarize the results.

Where conditions are indirect sunlight or overcast, almost all of the paints can be distinguished at distances greater than 200 feet. The CT-165 WR paint is an exception. It was noted that brown could easily be camouflaged by wood present in the background. Better clarity was achieved at 150 feet. The barber-pole sample could be seen at 175 and 200 feet but contrast between the colors was not possible. At 150 feet, contrast was identified.

All of the paints performed similarly in direct sunlight. Glare from the connector and/or conductor made viewing difficult. None of the paints could be easily spotted at distances greater than 25 feet. The results of the test are summarized in Tables 9a and 9b.

TABLE 9a

Summary of Visibility Test for Direct Sunlight

| Paint Model No. | Color | Maximum Viewing Distance. feet | Comments |
|---|---|---|---|
| KN 4 | Green | <25 | Direct sunlight causes glare from aluminum. Color is not discernable past 25 feet. |

TABLE 9a-continued

Summary of Visibility Test for Direct Sunlight

| Paint Model No. | Color | Maximum Viewing Distance. feet | Comments |
|---|---|---|---|
| KN 11 | Pink | <25 | Direct sunlight causes glare from aluminum. Color is not discernable past 25 feet. |
| MC-165-2 | Pink/Fuchsia | </5 | Direct sunlight causes glare from aluminum. Color is not discernable past 25 feet. |
| MC-104-2 | Green | <25 | Direct sunlight causes glare from aluminum.. Color is not discernable past 25 feet. |
| C-1¯1SWR | Magenta | <25 | Direct sunlight causes glare from aluminum. Color is not discernable past 25 feet. |
| CT 165WR | Brown | <25 | Direct sunlight causes glare from aluminum. Color is not discernable past 25 feet. |
| Barber Pole | Pink'Purple | <25 | Direct sunlight causes glare from aluminum. Color is not discernable past 25 feet. |

TABLE 9b

Summary of Visibility Test for Overcast Sky or Indirect Sunlight

| Paint Model No. | Color | Maximum Viewing Distance. feet | Comments |
|---|---|---|---|
| KN 4 | Green | >200 | Good clarity of color |
| KN 11 | Pink | >200 | Good clarity of color |
| MC-I65-2 | Pi Fuchsia | >200 | Good clarity of color |
| MC-104-2 | Green | >200 | Good clarity of color |
| C-HSWR | Magenta | >200 | Good clarity of color |
| CT 165WR | Brown | >150 | Color is susceptible to camouflage if wood is present in backdrop. |
| Barber Pole | Pink/Purple | ~150 | Contrast indiscernible at 175 and 200 feet. |

All of the paints exhibited good accuracy and repeatability. Time to color change for each paint occurred within the published 8° C. tolerance and 10-minute time frame. Results were repeatable for each sample. CT-165WR was not tested for performance because it was difficult to apply to constructed test loops. The paint proved to be easier to apply for the other evaluations, however. Another product, C-HSWR, did not adhere to the conductor loop well. In addition, despite conductor temperatures 20° C. above the nominal temperature, KN-4 failed to make the second color transition.

Results of the UV and thermal aging tests were very similar. Both showed that prolonged exposure to temperatures well below the trigger temperature caused some of the paints to change color. In particular, CT-165WR changed color within 125° C. of the second trigger temperature. Two paints. 101-4 and MC-165, maintained their original color, but temperatures were 50 to 80° C. below the published trigger temperatures. Physical degradation was limited to streaking for two of the paints and burns lines on another. Manufacturers note that weather resistance is lost at temperatures above 280° C., but can be prevented with a specialized formula that uses silicon resin.

The visibility test showed that an overhead line coated with any of the paints evaluated in this project can be adequately identified during a routine inspection. Viewing distance is dramatically affected by the location of the sun. Nevertheless, the worst case observed, 25 feet, is within reasonable distance for an on-ground or aerial inspection. If higher powered binoculars are used, viewing distances can be increased.

An example of choosing a temperature sensitive material for a conductor that operates as follows:

a. Normal operating temperatures: 800 hours max. at 90° C.

b. Special conditions: 8 hours max. at 95° C.

c. Emergency conditions: 2 hours max. at 120° C.

Under these conditions, a temperature sensitive material with the following characteristics (for example, KN11) could be used:

a. Trigger temperature: 135° C.

b. Transition time at 90° C.: N/A c. Transition time at 95° C.: >480 hours d. Transition time at 120° C.: >5 hours e. Transition time at 122° C.: 2 hours The embodiments of the described method and systems are not limited to the particular formulations, method steps, and materials disclosed herein as such formulations, process steps, and materials may vary somewhat. Moreover, the terminology employed herein is used for the purpose of describing exemplary embodiments only and the terminology is not intended to be limiting since the scope of the various embodiments of the present invention will be limited only by the appended claims and equivalents thereof.

Therefore, while embodiments of the invention are described with reference to exemplary embodiments, those skilled in the art will understand that variations and modifications can be effected within the scope of the invention as defined in the appended claims. Accordingly, the scope of the various embodiments of the present invention should not be limited to the above discussed embodiments, and should only be defined by the following claims and all equivalents.

The invention claimed is:

1. A method for monitoring the integrity of an overhead power connector, comprising:

applying a temperature sensitive coating that changes color at an irreversible color transition point to an overhead power connector and an overhead power conductor in an area adjacent to the overhead power connector, wherein the temperature sensitive coating is applied at least to a portion of the overhead power connector that is in electrical communication with the overhead power conductor; and comparing the color of the temperature sensitive coating on the overhead power conductor to the color of the temperature sensitive coating on the overhead power connector to determine the integrity of the overhead power connector, wherein the overhead power conductor comprises strands and the method further comprises replacing the overhead power connector when the temperature sensitive coating on the overhead power conductor indicates that a portion of the strands were above a temperature transition point and the temperature sensitive coating on another portion of the strands on the overhead power conductor indicates that the strands remained below the temperature transition point.

2. The method of claim 1, wherein the irreversible color transition point of the temperature sensitive coating is above a temperature of approximately 120° C.

3. The method of claim 2, wherein the irreversible color transition point of the temperature sensitive coating is above a temperature of approximately 135° C.

4. The method of claim 1, wherein the temperature sensitive coating is a dielectric coating.

5. The method of claim 1, further comprising:
replacing the overhead power connector.

6. The method of claim 1, further comprising:
monitoring the color of the temperature sensitive coating.

7. The method of claim 6, wherein monitoring the color of the temperature sensitive coating is conducted by helicopter.

8. The method of claim 1, further comprising replacing the overhead power connector when the temperature sensitive coating on the overhead power connector indicates the overhead power connector was above a temperature transition point and the temperature sensitive material on the overhead power conductor indicates that the overhead power conductor remained below the temperature transition point.

9. The method of claim 1, wherein the temperature sensitive coating is thermochromatic paint.

10. The method of claim 1, wherein the temperature sensitive coating is a plastic cover.

11. The method of claim 1, wherein the temperature sensitive coating undergoes at least one of a phase change, color change, or physical shape change.

12. The method of claim 1, wherein applying the temperature sensitive coating comprises:
applying a first temperature sensitive coating with a first irreversible color transition point to the overhead power connector; and
applying a second temperature sensitive coating with a second irreversible color transition point to the overhead power conductor, the second irreversible color transition point being different than the first irreversible color transition point.

13. A method for monitoring the integrity of an overhead power connector, comprising:
applying a temperature sensitive coating to an overhead power connector at least at a portion of the overhead power connector that is in electrical communication with an overhead power conductor, wherein the temperature sensitive coating comprises an irreversible color transition point at a temperature of at least 40° C. above the normal operating temperature of the overhead power connector; and
monitoring the color of the temperature sensitive coating on the overhead power connector to determine the integrity of the overhead power connector.

14. The method of claim 13, wherein the irreversible color transition point of the temperature sensitive coating is above a temperature of approximately 120° C.

15. The method of claim 14, wherein the irreversible color transition point of the temperature sensitive coating is above a temperature of approximately 135° C.

16. The method of claim 13, wherein the temperature sensitive coating is thermochromatic paint.

17. A system for monitoring the integrity of an overhead connector, comprising:
a first overhead power conductor for conducting electricity;
a second overhead power conductor for conducting electricity; and
a connector connected to the first overhead power conductor and the second overhead power conductor, wherein the connector comprises a temperature sensitive coating that changes color at an irreversible color transition point, applied at least to a portion of the connector that provides electrical communication between the first overhead power conductor and the second overhead power conductor,
wherein the irreversible color transition point of the temperature sensitive coating is at a temperature of at least 40° C. above the normal operating temperature of the connector.

18. The system of claim 17, wherein at least one of the first overhead power conductor and second overhead power conductor comprises a temperature sensitive coating in an area adjacent to the connector.

19. The system of claim 18, wherein both the first overhead power conductor and the second overhead power conductor comprise a temperature sensitive coating in an area adjacent to the connector.

20. The system of claim 17, wherein the irreversible color transition point of the temperature sensitive coating is at a temperature of at least 60° C. above the normal operating temperature of the connector.

21. The system of claim 17, wherein the irreversible color transition point of the temperature sensitive coating is at a temperature of at least 120° C.

22. The system of claim 17, wherein the irreversible color transition point of the temperature sensitive coating is at a temperature of at least 135° C.

23. The system of claim 17, wherein the temperature sensitive coating is a dielectric coating.

\* \* \* \* \*